(12) United States Patent
Wild et al.

(10) Patent No.: US 10,796,652 B2
(45) Date of Patent: Oct. 6, 2020

(54) DISPLAY DEVICE WITH NON-RECTANGULAR PIXELS

(71) Applicant: FlexEnable Limited, Cambridge, Cambridgeshire (GB)

(72) Inventors: Barry Wild, Cambridge (GB); William Reeves, Cambridge (GB); James Harding, Cambridge (GB)

(73) Assignee: FLEXENABLE LIMITED (GB)

( * ) Notice: Subject to any disclaimer, the term of this patent is extended or adjusted under 35 U.S.C. 154(b) by 0 days.

(21) Appl. No.: 16/285,955

(22) Filed: Feb. 26, 2019

(65) Prior Publication Data
US 2019/0272796 A1 Sep. 5, 2019

(30) Foreign Application Priority Data
Mar. 2, 2018 (GB) .................................. 1803447.0

(51) Int. Cl.
| | |
|---|---|
| G09G 3/36 | (2006.01) |
| G02F 1/1333 | (2006.01) |
| G02F 1/1362 | (2006.01) |
| G09G 3/3216 | (2016.01) |
| G09G 3/3225 | (2016.01) |
| H01L 27/32 | (2006.01) |
| H01L 51/00 | (2006.01) |

(52) U.S. Cl.
CPC ..... *G09G 3/3648* (2013.01); *G02F 1/133305* (2013.01); *G02F 1/136286* (2013.01); *G09G 3/3216* (2013.01); *G09G 3/3225* (2013.01); *G09G 3/3622* (2013.01); *H01L 27/3276* (2013.01); *H01L 27/3288* (2013.01); *H01L 51/0097* (2013.01); *G09G 2300/0426* (2013.01); *G09G 2300/0439* (2013.01); *G09G 2380/02* (2013.01)

(58) Field of Classification Search
CPC .. G09G 3/3648; G09G 3/3216; G09G 3/3225; G09G 3/3622; G09G 2300/0426; G09G 2300/0439; G09G 2380/02; G02F 1/133305; G02F 1/136286; H01L 27/3276; H01L 27/3288
See application file for complete search history.

(56) References Cited

U.S. PATENT DOCUMENTS

2016/0307528 A1* 10/2016 Zou ................... G02F 1/136286
2017/0186836 A1* 6/2017 Tada ................... H01L 27/3248

OTHER PUBLICATIONS

Search and Exam Report GB1803447.0 dated Nov. 14, 2018.

\* cited by examiner

*Primary Examiner* — Lisa S Landis
(74) *Attorney, Agent, or Firm* — Tarolli, Sundheim, Covell & Tummino LLP (57) ABSTRACT

A display device for conformal mounting on a curved surface inclined at an oblique angle relative to a horizontal plane, the display device comprising: a plurality of pixels, a first set of conductive lines connected to the plurality of pixels; and a second set of conductive lines connected to the plurality of pixels, wherein the first set of conductive lines and the second set of conductive lines are arranged to define a shape of each of the plurality of pixels such that the pixels appear, to a viewer, to extend at least one of horizontally or vertically across the display device when the display device is mounted on the curved surface.

17 Claims, 9 Drawing Sheets

DISPLAY DEVICE WITH NON-RECTANGULAR PIXELS

RELATED APPLICATIONS

The present invention is a U.S. Non-Provisional patent application, claiming priority to UK Serial No. 1803447.0, filed on 2 Mar. 2018, the entirety of which is incorporated herein by reference.

TECHNICAL FIELD

The present disclosure relates to a display device for conformal mounting on a curved surface.

BACKGROUND

A variety of display devices have been developed. Examples thereof include liquid crystal display (LCD) devices and organic light emitting display (OLED) devices. These displays are generally used in various electronic devices such as a mobile telephones, televisions, digital signage etc.

These known display devices are typically driven by a matrix of conductive lines arranged in rows and columns.

In a passive matrix display device, the row electrode (x-line) is addressed time-sequentially addressed single line by single line, and the emission intensity of each pixel is controlled by a signal from the corresponding column electrode (y-line) with each pixel having to maintain its state passively, without being driven by circuitry.

Figure 1:
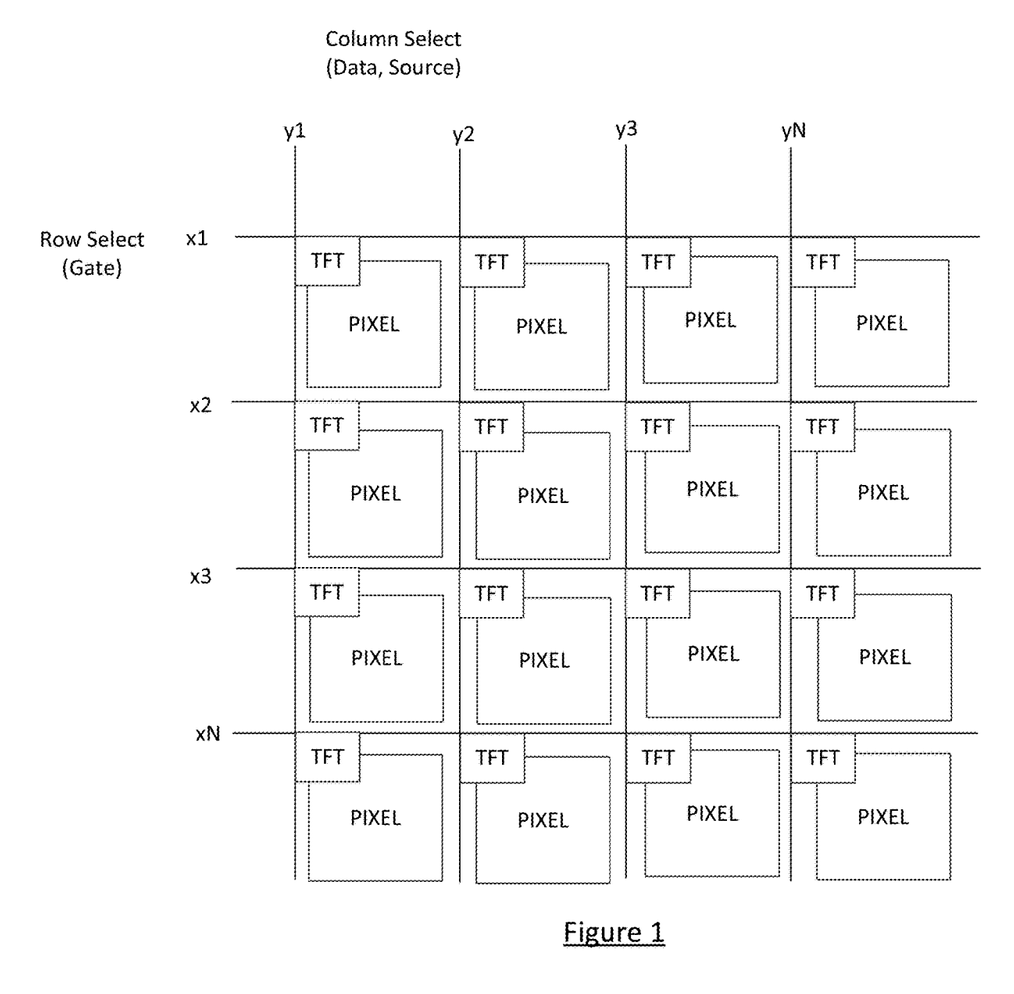
FIG. 1 shows a simplified representation of a known active matrix array.

In contrast, in an active matrix display device the emission of each pixel is typically controlled using one or more thin film transistor (TFT) located at the point of intersection between the x- and y-lines. The row electrode (x-line) is addressed time-sequentially addressed single line by single line, and the emission intensity of each pixel is controlled by a signal from the corresponding column electrode (y-line) with each pixel actively maintaining the pixel state while other pixels are being addressed. An active matrix array (in simplified form) is illustrated in FIG. 1.

In both passive and active matrix display devices, the arrangement of the conductive lines define the shape of pixels of the display device to be square or rectangle (due to the grid structure of the conductive lines).

SUMMARY

A display device with square or rectangular pixels may be mounted to a curved surface such as a cylinder. In this scenario, the inventors have identified that display quality is not impacted if the display is "on-axis" to the viewer. The term "on axis" is used herein to refer to the rows of pixels of the display device and/or the columns of pixels of the display device being in parallel (within a tolerance) with either a vertical axis extending vertically between a viewer's eyes or a horizontal axis extending horizontally between a viewer's eyes.

The inventors have identified that when the curved surface is tilted (for example when the display device is mounted to an A-pillar in a car) the viewing direction between the viewer and display device with square or rectangular pixels comes off-axis which has a detrimental effect on the display quality perceived by the viewer (e.g. the contrast ratio will decrease).

Embodiments of the present invention relate to changing the pitch and shape of pixels (compared to the pitch and pixel shape of known display devices) to match the angle of tilt of a curved surface that is tilted relative to horizontal plane, to minimise the viewer looking at a display off-axis.

According to one aspect of the present invention there is provided a display device for conformal mounting on a curved surface inclined at an oblique angle relative to a horizontal plane, the display device comprising: a plurality of pixels, a first set of conductive lines connected to the plurality of pixels; and a second set of conductive lines connected to the plurality of pixels, wherein the first set of conductive lines and the second set of conductive lines are arranged to define a shape of each of the plurality of pixels such that the pixels appear, to a viewer, to extend at least one of horizontally or vertically across the flexible display device when the flexible display device is mounted on the curved surface.

The shape and a size of each of the plurality of pixels may be uniform.

The shape of each of the plurality of pixels may be a rhombus and has a pair of equal opposing angles corresponding to said oblique angle of inclination of the curved surface.

The shape of each of the plurality of pixels may be a rhomboid and has a pair of equal opposing angles corresponding to said oblique angle of inclination of the curved surface.

In other embodiments, the shape and a size of each of the plurality of pixels is non-uniform.

The shape of each of the plurality of pixels may have one or more of: curved sides, internal angles which sum to an angle different to 360 degrees, and non-parallel sides.

The first set of conductive lines and the second set of conductive lines are arranged such that the pixels appear, to a viewer at predetermined fixed position relative to the flexible display device, to extend both horizontally and vertically across the flexible display device when the flexible display device is mounted on the curved surface inclined at the oblique angle relative to the horizontal plane.

The plurality of pixels may comprise: a first substrate; a second substrate disposed over and spaced from the first substrate; and a display medium disposed between the first and second substrates.

The display medium may be an organic or inorganic liquid crystal display medium.

The display medium may be an organic light emitting diode display medium.

The first set of conductive lines and the second set of conductive lines may form an active matrix array or alternatively form a passive matrix array.

The display device may be flexible.

Each pixel may comprise a plurality of sub-pixels, and at least one sub-pixel of the plurality of sub-pixels may be connected to a first conductive line of the first set of conductive lines, and at least one further sub-pixel in the pixel may be connected to at least one further conductive line of the first set of conductive lines.

Each pixel may comprise a plurality of sub-pixels, and at least one sub-pixel of the plurality of sub-pixels may be connected to a first conductive line of the second set of conductive lines, and at least one further sub-pixel in the pixel may be connected to at least one further conductive line of the second set of conductive lines.

According to another aspect of the present invention there is provided a method of manufacturing a display device, the method comprising: determining an oblique angle of a curved surface inclined relative to a horizontal plane onto which the flexible display device is to be mounted; arranging a first set of conductive lines and a second set of conductive lines to define a shape of each of a plurality of pixels such that the pixels appear, to a viewer, to extend at least one of horizontally or vertically across the flexible display device when the flexible display device is mounted on a curved surface inclined at the oblique angle relative to a horizontal plane; forming the plurality of pixels according to the defined shape of each of the plurality of pixels; and connecting the first set of conductive lines and the second set of conductive lines to the plurality of pixels.

The first set of conductive lines and a second set of conductive may be arranged to define a parallelogram shape of each of the plurality of pixels, the parallelogram having a pair of equal opposing angles corresponding to said oblique angle of inclination of the curved surface.

Alternatively, the arranging may comprise: using a computing device to generate a three-dimensional model of the curved surface; and project a grid onto the curved surface such that the grid is distorted by the surface; and arranging the first set of conductive lines and the second set of conductive lines such that the plurality of pixels have shapes defined by the distorted grid.

According to another aspect of the present invention there is provided a system comprising: a display device for conformal mounting on a curved surface inclined at an oblique angle relative to a horizontal plane; and an item having the curved surface; wherein the display device comprises: a plurality of pixels; a first set of conductive lines connected to the plurality of pixels; and a second set of conductive lines connected to the plurality of pixels, wherein the first set of conductive lines and the second set of conductive lines are arranged to define a shape of each of the plurality of pixels such that the pixels appear, to a viewer, to extend at least one of horizontally or vertically across the flexible display device when the flexible display device is mounted on the curved surface.

According to another aspect of the present invention there is provided a method of displaying an image on a pixelated display, the method comprising: configuring the display such that pixels of the display have a parallelogram shape; mounting the display on a curved or tilted surface; and displaying an image on the display.

A method of displaying an image on a pixelated display, the method comprising: projecting a grid onto a surface such that the grid is distorted by the surface; configuring the display such that pixels of the display have shapes defined by the distorted grid; mounting the display the surface; and displaying an image on the display.

According to another aspect of the present invention there is provided a method of manufacturing a pixelated display, the method comprising: projecting a grid onto a surface such that the grid is distorted by the surface; determining shapes for pixels of the display from the distorted grid; and manufacturing a display with the determined pixel shapes.

These and other aspects will be apparent from the embodiments described in the following. The scope of the present disclosure is not intended to be limited by this summary nor to implementations that necessarily solve any or all of the disadvantages noted.

BRIEF DESCRIPTION OF THE DRAWINGS

Some preferred embodiments of the disclosure will now be described by way of an example only and with reference to the accompanying drawings, in which:

FIG. 6 illustrates an example cross-section of the display device of FIG. 4a;

DETAILED DESCRIPTION

Embodiments will now be described by way of example only.

Figure 2A:
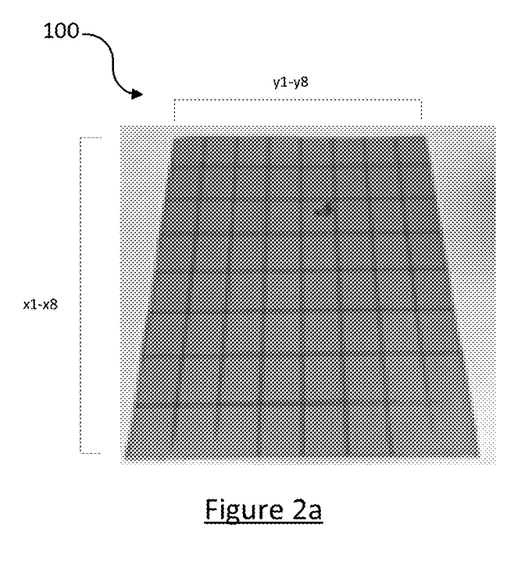
FIG. 2a illustrates a known flexible display device positioned flat on a horizontal surface.
Figure 2B:
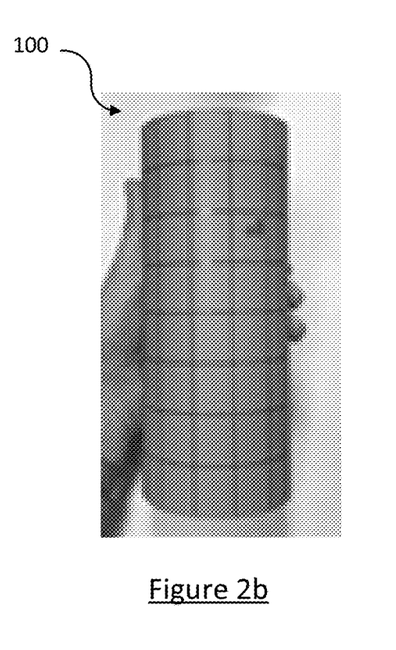
FIG. 2b illustrates the known flexible display device of FIG. 2a conformally mounted to a vertical cylinder.
Figure 2C:
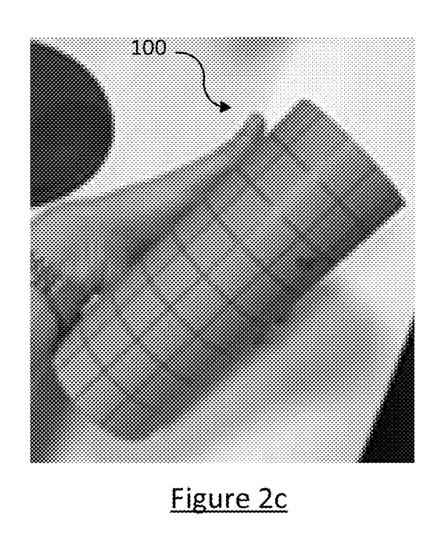
FIG. 2c illustrates the known flexible display device of FIG. 2a conformally mounted to a cylinder which is tilted at an oblique angle relative to a horizontal plane.

Reference is first made to FIGS. 2a-c which illustrate a known flexible display device 100 having a plurality of pixels. As shown most clearly in FIG. 2a (which shows the flexible display device 100 positioned flat on a horizontal surface), the known flexible display device 100 has an arrangement of rectangular pixels. The known flexible display device is shown as having 64 pixels for clarity and it will be appreciated that this is merely an example. The arrangement of the conductive row electrodes (x1-x8) extending horizontally across the display device and the conductive column electrodes (y1-y8) extending vertically across the display device define the shape of pixels of the display device.

FIG. 2b illustrates the known flexible display device 100 of FIG. 2a conformally mounted to a vertical cylinder. That is, the flexible display device 100 has been wrapped around the vertical cylinder. As explained above, in this scenario the display quality for the viewer is not impacted if the display device is viewed "on-axis" to the viewer.

However if the known flexible display device 100 of FIG. 2a is conformally mounted to a curved surface (e.g. a cylinder) which is inclined at an oblique angle relative to a horizontal plane, the conductive row electrodes will not be in parallel with either a vertical axis extending vertically between a viewer's eyes or a horizontal axis extending horizontally between a viewer's eyes. Similarly, the conductive column electrodes will not be in parallel with either a vertical axis extending vertically between a viewer's eyes or a horizontal axis extending horizontally between a viewer's eyes.

Figure 3:
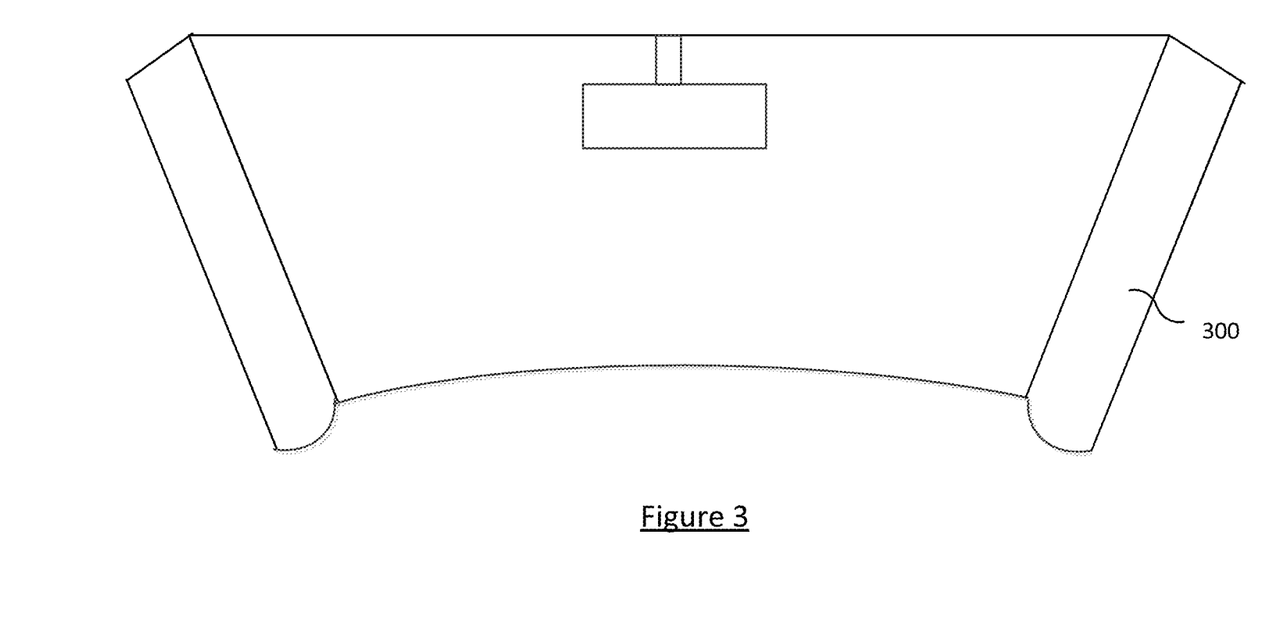
FIG. 3 illustrates an interior of a vehicle having a curved surface inclined at an oblique angle relative to a horizontal plane.

An example of such an inclined curved surface is an A-pillar 300 in a car shown in FIG. 3.

The display device in embodiments of the invention described below, advantageously provides improved display quality when the display device is conformally mounted to a curved surface which is inclined at an oblique angle relative to a horizontal plane.

We describe what is meant by viewing a display on-axis and off axis with reference to FIGS. 4*a-d*.

Figure 4A:
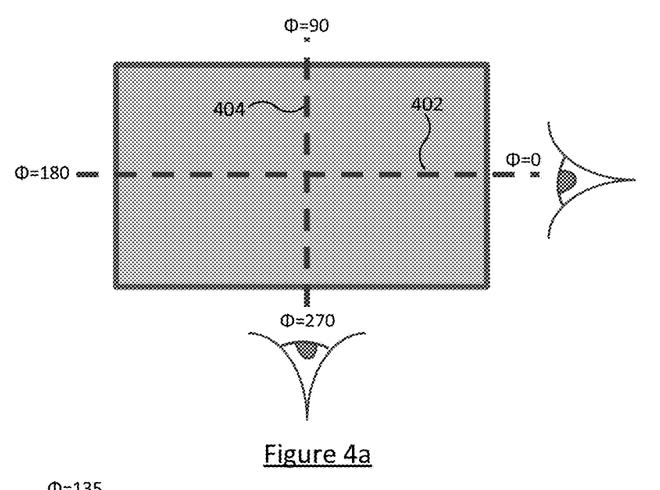
FIGS. 4a and 4b illustrate on-axis viewing of a display.

A display device has a horizontal axis 402 and a vertical axis 404. A viewing direction is defined by an angle of inclination θ measured from the surface normal 406 of the display, and an azimuth angle Φ which is the angle that the projection of the viewing direction onto the surface of the display makes with the horizontal axis 402.

FIG. 4*a* illustrates the azimuth angle Φ increasing counter-clockwise around the plane of the display device. The display device is truly "on-axis" to the viewer if the viewing direction is parallel with either the horizontal axis 402 (i.e. the azimuth angle Φ=0° or 180°) or the vertical axis 404 (i.e. the azimuth angle Φ=90° or 270°). It will be appreciated that an on axis usually refers to the single angle pointing directly at the display. i.e. the normal to the surface.

Figure 4B:
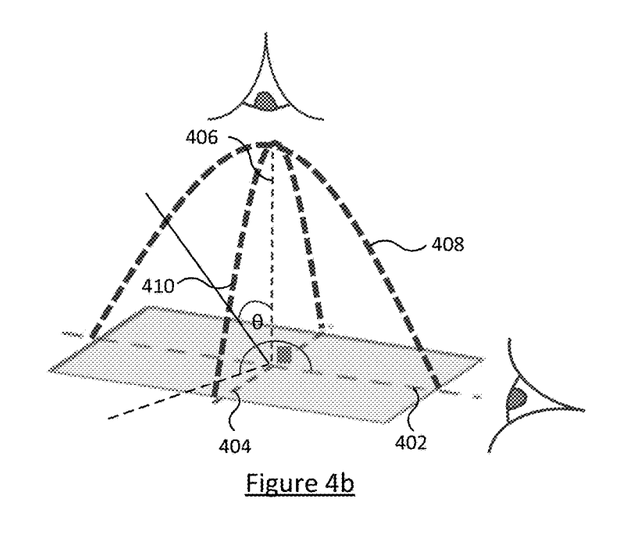

As shown in FIG. 4*b*, a viewer viewing the display device at a viewing direction specified by an azimuth angle Φ of 0° is viewing the display device on-axis regardless of the angle of inclination θ. That is, the viewer is viewing the display device on-axis regardless of where along dashed line 408 they are viewing the display device from.

Furthermore as shown in FIG. 4*b*, a further viewer viewing the display device at a viewing direction specified by an azimuth angle Φ of 90° is viewing the display device on-axis regardless of the angle of inclination θ. That is, the viewer is viewing the display device on-axis regardless of where along dashed line 408 they are viewing the display device from.

Figure 4C:
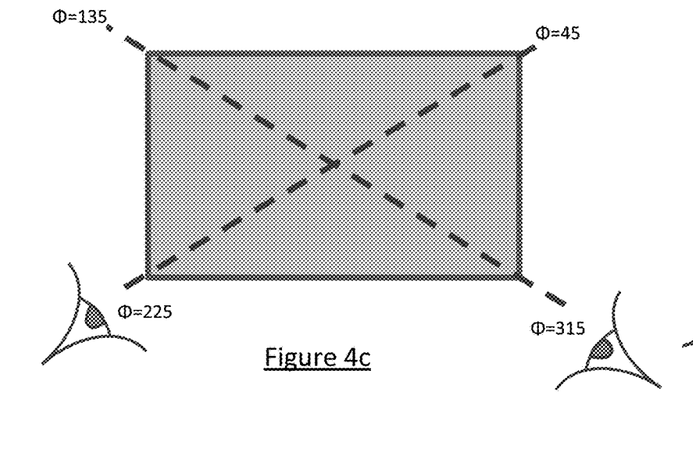
FIGS. 4c and 4d illustrate off-axis viewing of a display.
Figure 4D:
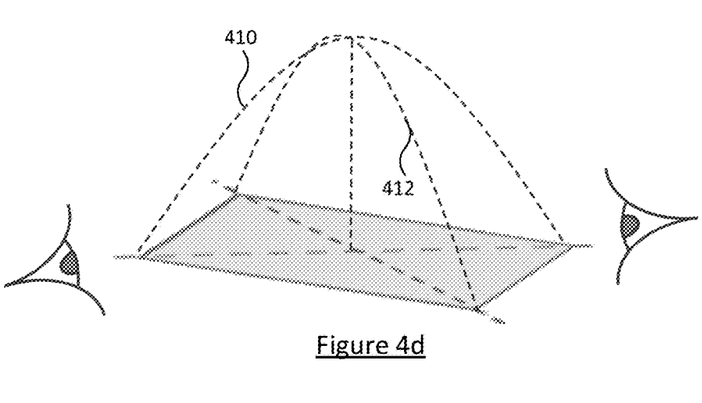
Figure 5A:
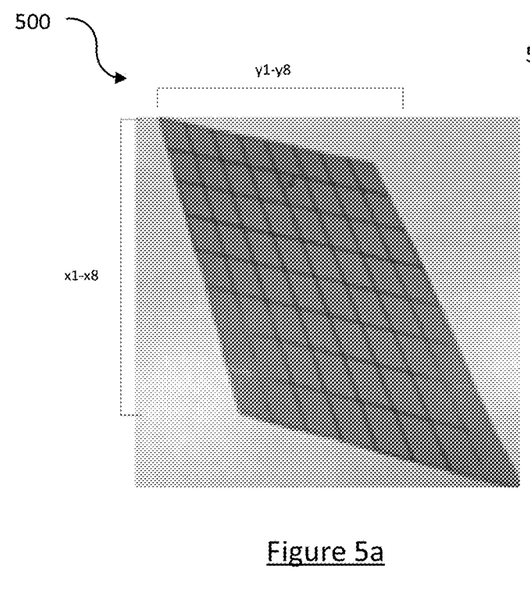
FIG. 5a illustrates a display device according to a first embodiment of the present invention positioned flat on a horizontal surface.
Figure 5B:
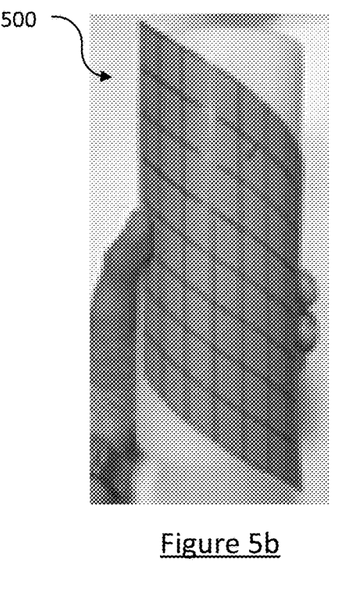
FIG. 5b illustrates the display device of FIG. 5a conformally mounted to a vertical cylinder.
Figure 5C:
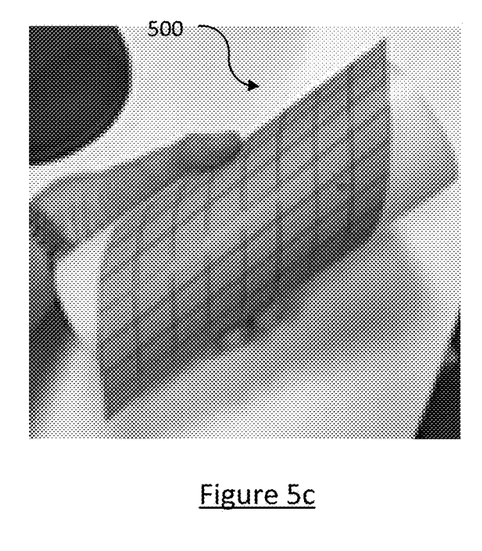
FIG. 5c illustrates the display device of FIG. 5a conformally mounted to a cylinder which is tilted at an oblique angle relative to a horizontal plane.

FIGS. 4*c* and 4*d* illustrates a viewer viewing the display device at a viewing direction specified by an azimuth angle Φ of 225° and is thus is viewing the display device off-axis, and a further viewer viewing the display at a viewing direction specified by an azimuth angle Φ of 315° and is thus also viewing the display off-axis A display device 500 according to a first embodiment is shown in FIGS. 5*a-c*. The display device 500 is designed to be conformally mounted to a curved surface which is inclined at an oblique angle relative to a horizontal plane.

FIG. 5*a* illustrates the display device 400 positioned flat on a horizontal surface;

As shown in FIG. 5*a*, the conductive row electrodes and the conductive column electrodes are arranged to define a shape and size of each of the plurality of pixels that is uniform across the display. The shape of each of the plurality of pixels is a parallelogram (e.g. a rhombus or rhomboid) and has a pair of equal opposing angles corresponding to the oblique angle of inclination of the curved surface onto which the display device is to be mounted. Thus it will be appreciated that the conductive row electrodes and the conductive column electrodes of the display device 500 are arranged by having prior knowledge of the angle of inclination of the curved surface onto which the display device is to be mounted. The pixels, instead of being square or rectangular are distorted parallelograms.

FIG. 5*b* illustrates the display device 500 conformally mounted to a vertical cylinder and FIG. 5*c* illustrates the display device 500 conformally mounted to a cylinder which is tilted at the oblique angle referred to above.

As shown in FIG. 5*c*, due to the arrangement of the conductive row electrodes (x1-x8) and the conductive column electrodes (y1-y8), when the display device 500 is conformally mounted to the cylinder which is tilted at the oblique angle the conductive row electrodes (x1-x8) extend vertically such that pixels appears to a viewer to extend vertically across the display device 500

That is, the rows of pixels of the display device 500 are in parallel (within a tolerance) with a vertical axis extending vertically between a viewer's eyes and thus the display device is "on-axis" to the viewer.

In the context of the first embodiment, this tolerance is defined as the viewing direction being associated with an azimuth angle Φ which is within 20° from the horizontal axis 402 or vertical axis 404.

Referring back to FIG. 4*a* which illustrates the azimuth angle Φ increasing counter-clockwise around the plane of the display device. In this example, the display device 500 is "on-axis" to the viewer if 0°≤Φ≤20°, 70°≤Φ≤110°, 160°≤Φ≤200°, 250°≤Φ≤290° or 340°≤Φ≤360°.

The display device 500 is "off-axis" to a viewer if two conditions are satisfied namely that (i) the viewing direction is associated with an azimuth angle Φ which is greater than 20° from the horizontal axis 402 or vertical axis 404; and (ii) the viewing direction is associated with an angle of inclination θ that is greater than 20° from the surface normal 406.

Due to the way the display device 500 is conformally mounted to a surface as shown in FIG. 5*b*, pixels appears to a viewer (viewing the display on-axis) to extend vertically across the display device 500 and do not appear to the viewer to extend horizontally across the display device 500. However it will be appreciated that the display device 500 may be conformally mounted to the cylinder which is tilted at the oblique angle such that the conductive column electrodes (y1-y8) extend horizontally such that pixels appears to a viewer to extend horizontally across the display device 500.

The display device 500 can advantageously be viewed on-axis by multiple viewers at different positions with respect to the display device 500.

In the first embodiment, conductive row electrodes and the conductive column electrodes are arranged to define a shape and size of each of the plurality of pixels that is uniform across the display. Each of the plurality of pixels is a parallelogram having a pair of equal opposing angles corresponding to the oblique angle of inclination of the curved surface onto which the display device is to be mounted. Each pixel may comprise a plurality of sub-pixels forming a single pixel e.g. three sub-pixels comprising a red sub-pixel, a green sub-pixel and a blue sub-pixel (RGB) or four sub-pixels additionally comprising a white sub-pixel (RGBW).

Each sub-pixel in a pixel may be driven by the same row electrode in the display device 500. Similarly, each sub-pixel in a pixel may be driven by the same column electrode in the display device 500.

Figure 6:
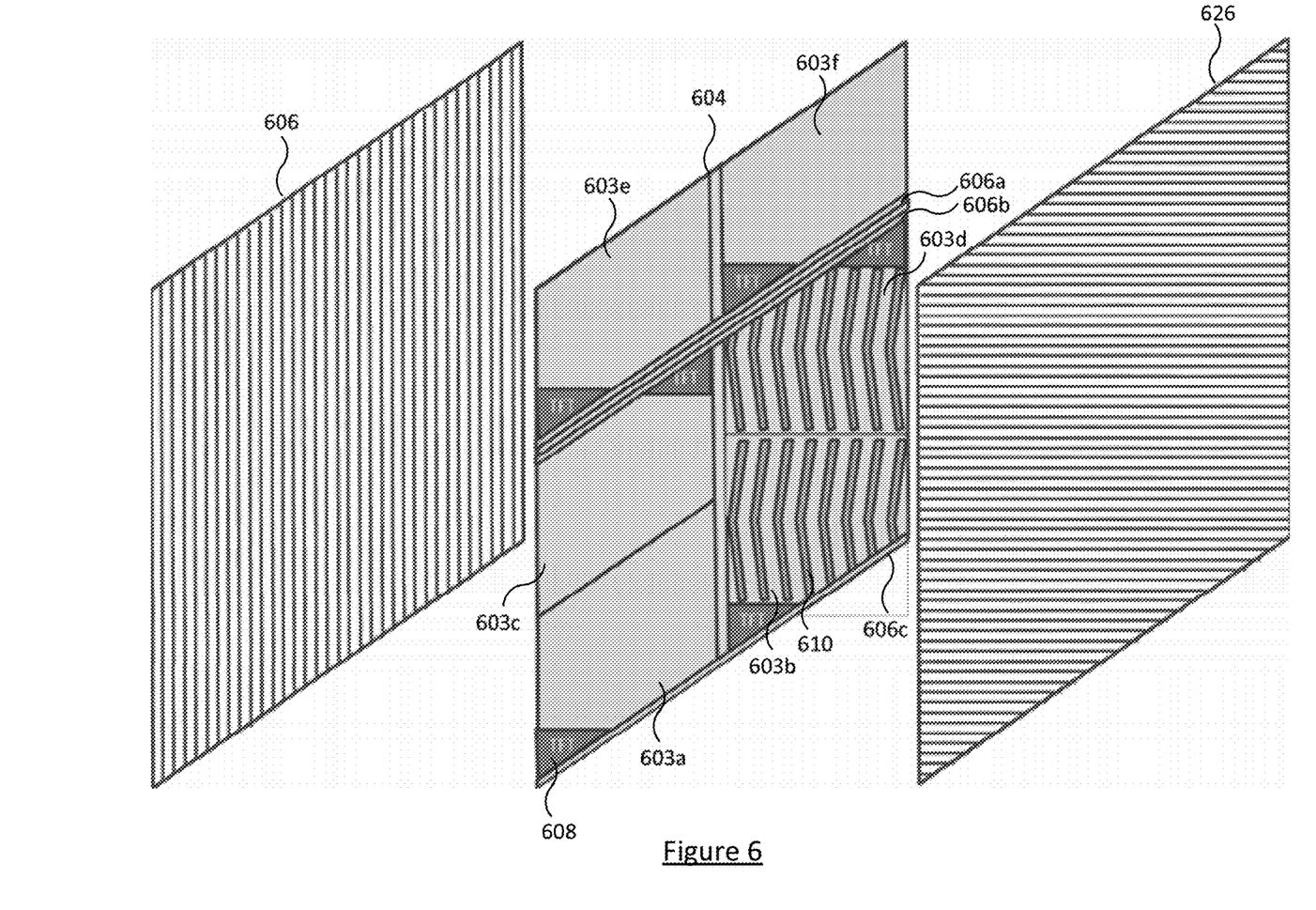

FIG. 6 illustrates an arrangement of row and column electrodes which can maximise the area that can transmit light and is not blocked by tracking and TFTs. FIG. 6 illustrates an example cross-section of the display device 500 in an example when the display device is a fringe-field switching (FFS) LCD display device. It will be appreciated that this particular type of display device is merely an example and as described in more detail below, embodiments of the present invention can be applied to a wide variety of different types of display device.

In the structure of FIG. 6, a first polariser film or layer 606 is provided above a backlight (not shown). Control circuitry is provided above the first polariser layer 606, which include an array of thin film transistors (TFTs) 608 connected to a plurality of row electrodes 606 and a plurality of conductive column electrodes 604. The plurality of row electrodes 606 may be connected to the gate terminals of the TFTs 608 with the plurality of conductive column electrodes 604 connected to the source-drain terminals of the TFTs 608. Alternatively, the plurality of row electrodes 606 may be connected to the source-drain terminals of the TFTs 608 with the plurality of conductive column electrodes 604 may be connected to the gate terminals of the TFTs 608. A plurality of sub-pixels 603 form a pixel. Each of the TFTs are connected to, and configured to control a sub-pixel 603 of a pixel.

In one example the four sub-pixels 603a, 603b, 603c, and 603d may form a single pixel (with sub-pixels 603e and 603f forming part of a further pixel). As shown in FIG. 6, the shape of the pixel formed from sub-pixels 603a, 603b, 603c, and 603d is a parallelogram having a pair of equal opposing angles corresponding to the oblique angle of inclination of the curved surface onto which the display device is to be mounted.

In another example the three sub-pixels 603a, 603c, and 603e may form a single pixel and the three sub-pixels 603b, 603d, and 603f may form a further single pixel. As shown in FIG. 6, the shape of the pixel formed from sub-pixels 603a, 603c, and 603e is a parallelogram having a pair of equal opposing angles corresponding to the oblique angle of inclination of the curved surface onto which the display device is to be mounted.

As shown in FIG. 6, two row electrodes 606 may be provided adjacent to each other (see for example row electrodes 606a,b) such that one of the row electrodes 606a is coupled to and drives upper sub-pixels 603e and 603f, and the other of the row electrodes 606b is coupled to and drives the lower sub-pixels 603c and 603d. This arrangement may be repeated amongst the other row electrodes 606. Whilst this has been described with reference to the row electrodes 606, it will appreciated the same also applies to the column electrodes in that two column electrodes 604 may be provided adjacent to each other such that one of the column electrodes is coupled to and drives the left sided sub-pixels and the other of the column electrodes is coupled to and drives the right sided sub-pixels.

Thus in the first embodiment, at least one sub-pixel in a pixel may be driven by a first row electrode and at least one further sub-pixel in the pixel may be driven by at least one further row electrode (different to the first row electrode). Alternatively, each subpixel within a given pixel could be driven by the same row electrode.

Taking the pixel formed by the four sub-pixels 603a, 603b, 603c, and 603d as an example, it will be apparent from FIG. 6 that the sub-pixels 603a and 603b are driven by row electrode 606c and the sub-pixels 603c and 603d are driven by row electrode 606b. Taking the pixel formed by the three sub-pixels 603a, 603c, and 603e as an example, it will be apparent from FIG. 6 that the sub-pixel 603a is driven by row electrode 606c, sub-pixels 603c is driven by row electrode 606b, and sub-pixel 603e is driven by row electrode 606a.

Furthermore, in the first embodiment, at least one sub-pixel in a pixel may be driven by a first column electrode and at least one further sub-pixel in the pixel may be driven by at least one further column electrode (different to the first column electrode).

Taking the pixel formed by the four sub-pixels 603a, 603b, 603c, and 603d as an example, it will be apparent from FIG. 6 that sub-pixel 603a is driven by a column electrode (not shown in FIG. 6), sub-pixels 603b and 603c are driven by column electrode 604, and sub-pixel 603d is driven by a further column electrode (not shown in FIG. 6) which is different to the column electrode configured to drive sub-pixel 603a.

Taking the pixel formed by the three sub-pixels 603a, 603c, and 603e as an example, it will be apparent from FIG. 6 that the sub-pixels 603a and 603e are driven by a column electrode (not shown in FIG. 6) and sub-pixel 603c is driven by column electrode 604.

The shape of each sub-pixel in a pixel may be parallelogram having a pair of equal opposing angles corresponding to the oblique angle of inclination of the curved surface onto which the display device is to be mounted. Alternatively in a FFS LCD display device or an in-plane switching (IPS) display device the shape of each sub-pixel may not be parallelogram having a pair of equal opposing angles corresponding to the oblique angle of inclination of the curved surface onto which the display device is to be mounted. It will be understood that the intent is to show that despite the parallelogram the electrodes are drawn with respect to the expected viewer.

A second polariser film or layer 626 is provided above the pixels.

The various layers which may be provided in the structure of each pixel is known and is therefore not discussed in detail herein. For illustration purposes the chevron shaped pixel electrodes 610 of the FFS LCD display device are shown. For ease of manufacture the lines of the first polariser layer 606 may be arranged to be perpendicular to the lines of the second polariser layer 626, and the pixel electrodes are provided with 6-16 degree shift forming the chevron shape.

When the display device 500 of the first embodiment is mounted to the curved surface for which the display device has been designed for (i.e. the parallelogram shape of the pixels have a pair of equal opposing angles corresponding to the oblique angle of inclination of the curved surface), pixels will appear to extend vertically (or horizontally) across the display device to ensure the display device is viewed on-axis (within a tolerance).

In a second embodiment described below, the conductive row electrodes and the conductive column electrodes are arranged to define a shape and size of each of the plurality of pixels such that the pixels appear, to a viewer at a predetermined fixed position relative to the display device, to extend both horizontally and vertically across the display device when the display device is mounted on the curved surface inclined at the oblique angle relative to the horizontal plane.

In this embodiment the viewing direction of the viewer at a predetermined fixed position relative to the display device is taken into account when designing the display device such that the display device looks flat to only this particular viewer. For example, for a driver sitting in a driving seat of a car looking at the display device when it is mounted on a A-pillar 300 of the car.

Figure 7A:
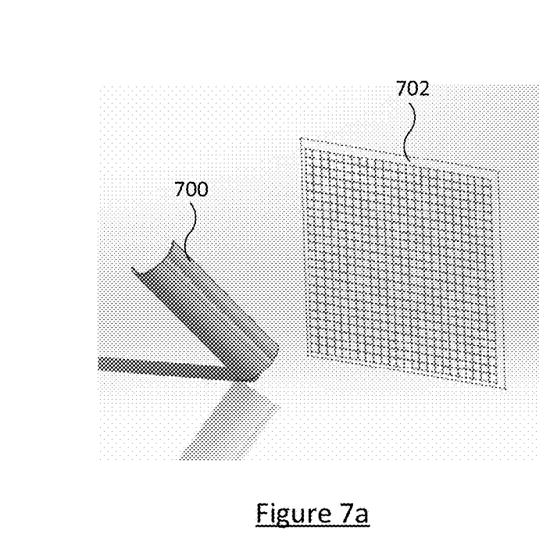
FIG. 7a-c illustrates steps for manufacturing a display device according to a second embodiment of the present invention.

A method of designing the shape and size of each of the plurality of pixels of a display device according to the second embodiment is described below with reference to FIGS. 7a-7c.

As a first step, a surface model 700 of the inclined curved surface is created using 3D modelling software executed on a computing device using well known techniques. As shown in FIG. 7a, the model 700 is placed together in the 3D space with a graphical wire grid 702 with approximately the correct orientation. The graphical wire grid 702 represents the plurality of conductive row electrodes and conductive column electrodes that will be arranged in the manufactured display device, and has a plurality of squares or rectangles.

Figure 7B:
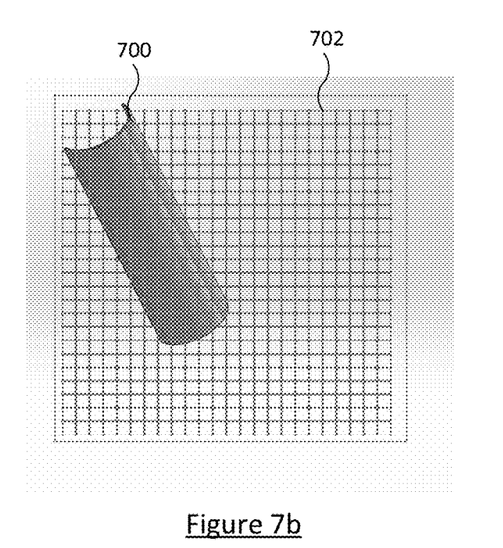
Figure 7C:
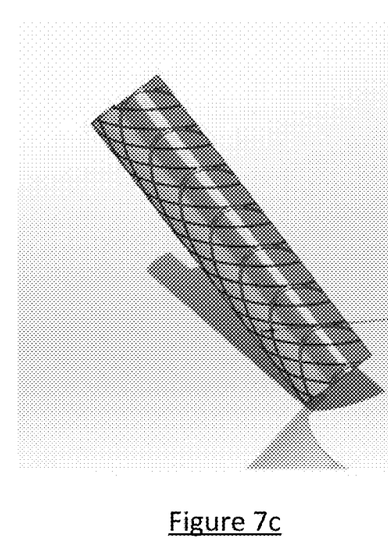

As a second step, as shown in FIG. 7b the surface model 700 is orientated to a position that the inclined surface would have if being viewed from a viewer in a fixed position (e.g. a driver of a car), and then the graphical wire grid 702 is transposed onto the surface model 700. That is, a single azimuth angle Φ and a single angle of inclination θ defining the viewing direction of the viewer at the fixed position is taken into account to transpose the graphical wire grid 702 onto the surface model 700.

By performing this transposition, it is possible to see the shape of the distortion that is required to the pixels so that the display device looks flat to the viewer at the fixed position. FIG. 7c illustrates the graphical wire grid 702 transposed onto the surface model 700. This pattern is an effective description of the distortion that is needed to the shape of the pixels that is needed to be introduced so that so that the display device looks flat to the viewer.

Figure 8:
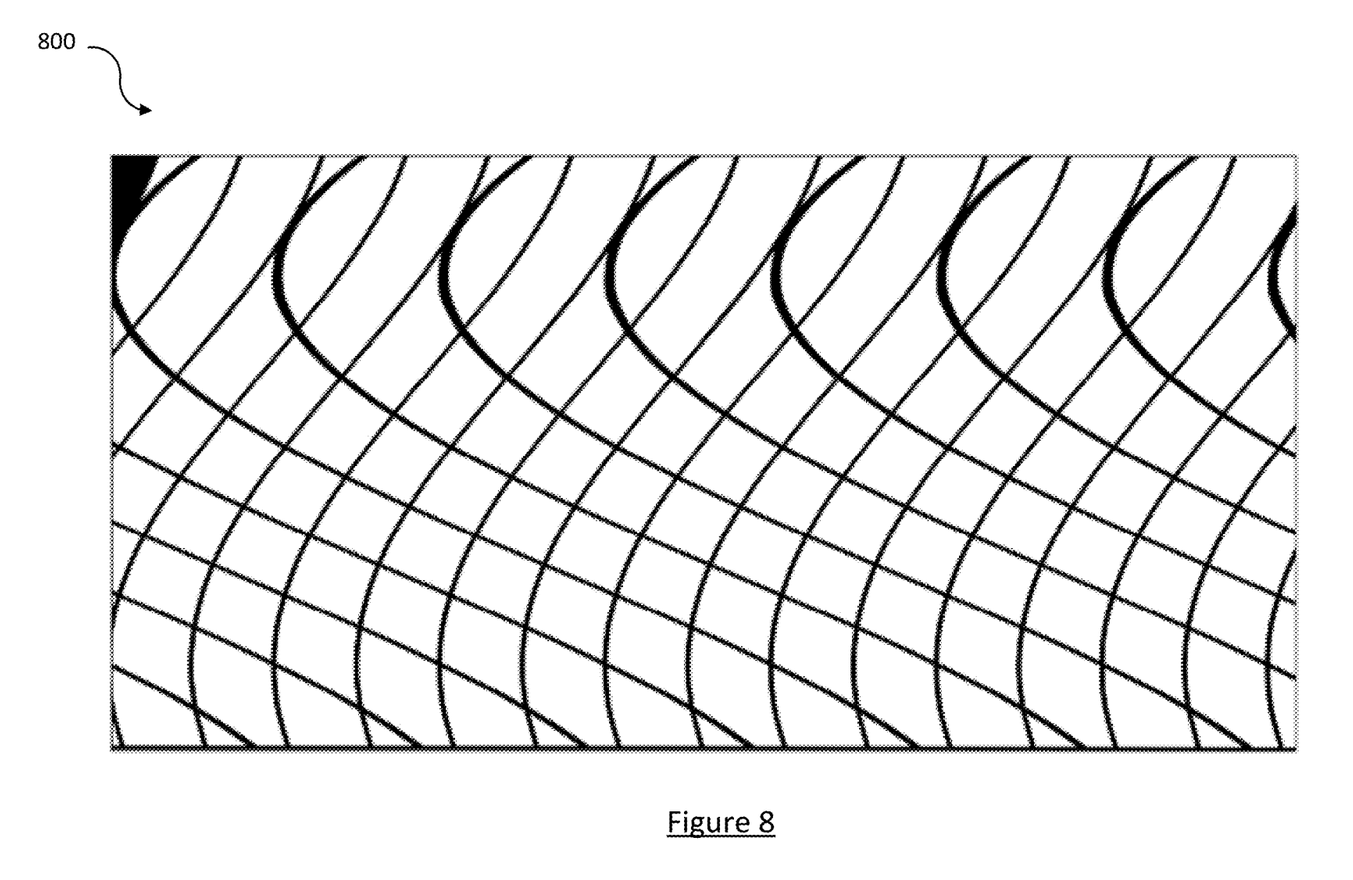
FIG. 8 illustrates an example pattern of conductive lines for the display device according to the second embodiment of the present invention.

As a third step, the surface model 700 onto which the graphical wire grid 702 has been transposed (shown in FIG. 7c) is flattened to produce a pixel display layout 800 shown in FIG. 8. It will be appreciated that the pixel display layout 800 shown in FIG. 8 is merely an example to illustrate the concept.

A display device is then manufactured wherein the conductive row electrodes and the conductive column electrodes are arranged in accordance with the pixel display layout 800 to define a shape and size of each of the plurality of pixels in the display device. As illustrated in the pixel display layout 800 the display device according to the second embodiment has a plurality of pixels whereby the shape and a size of each of the plurality of pixels is non-uniform.

As shown in the pixel display layout 800, the display device according to the second embodiment may have pixels which are non-parallelogram in shape. Instead, the shape of each of the plurality of pixels has one or more of: curved sides, internal angles which sum to an angle different to 360 degrees, and non-parallel sides.

Figure 9:
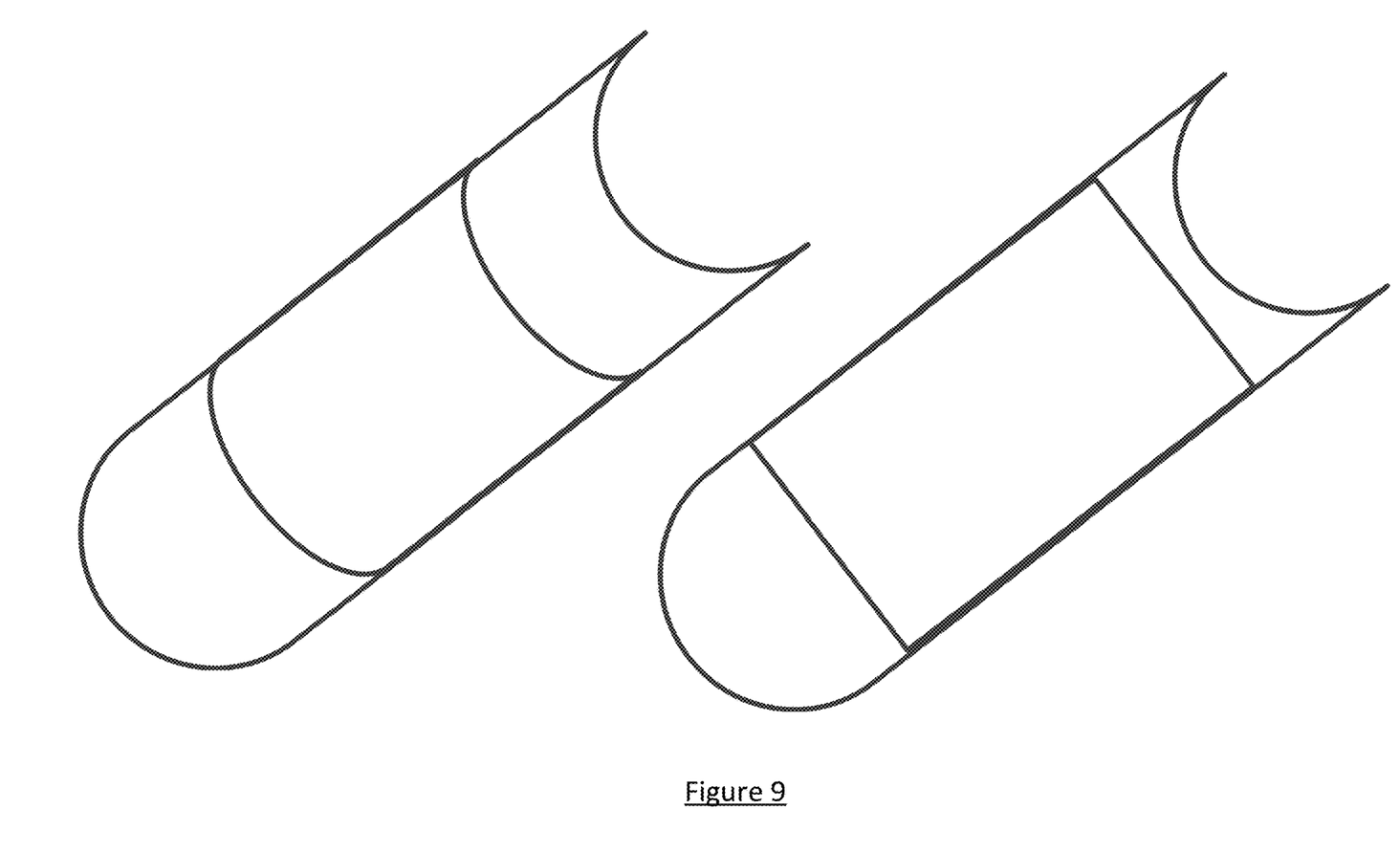
FIG. 9 illustrates the appearance of the display device according to the second embodiment to a viewer.

When the display device of the second embodiment is mounted to the inclined curved surface for which the display device has been designed for, pixels will appear to the viewer at the predetermined fixed position to extend both horizontally and vertically across the display device. This will make the curved display device (as shown in the left hand side of FIG. 9) on the inclined curved surface appear, for one person (e.g. the driver) at the predetermined fixed position to look like a flat projection on the curved surface (as shown in the right hand side of FIG. 9).

When the display devices of the embodiments described above are mounted to an inclined curved surface such as an A-pillar 300 in a car shown in FIG. 3 the display quality for the viewer is advantageously improved. An A-pillar of a car is just one example of an inclined curved surface onto which display devices of the embodiments described herein may be mounted. The inclined curved surface may be in any vehicle which is used to transport goods and/or people by land, sea or air. For example the display device may be use to provide a visual aid to a driver of a vehicle or pilot of a plane. This may include having a camera coupled to the display device for capturing an exterior of the vehicle or plane and displaying the captured image data on the display device such that the inclined curved surface appears transparent to the viewer. This advantageously removes any blind spots that would otherwise be present in the driver's or pilot's field of view. Alternatively or additionally the display device may be used to display vehicle sensor data (e.g. speed, mileage, engine temperature, fuel consumption etc), or in-car entertainment data.

Whilst the above refers to an inclined curved surface in a vehicle, this is merely an example and embodiments described herein extend to the display devices being mounted to any item that has an inclined curved surface.

The pixels of the display device of the embodiments described above comprise a plurality of layers the arrangement of which is known to persons skilled in the art. Generally, the plurality of pixels comprise a first layer comprising a first substrate, a second layer disposed over and spaced from the first substrate; and a display medium disposed between the first and second layers, whereby the second layer comprises a second substrate and/or encapsulation layer.

The display device may be an LCD display device (the pixels having a first and second substrate) whereby the display medium is a liquid crystal display medium. The LCD display device may operate in accordance with one of a plurality of known technologies for example the LCD display device may be a twisted nematic (TN) display device, a fringe-field switching (FFS) display device, an in-plane switching (IPS) display device, a plane-to-line switching (PLS) display device, or operate in accordance with another well known LCD technology not described herein.

Alternatively the display device may be a light emitting diode (LED) display device whereby the display medium is an organic (e.g. an OLED display device) or inorganic LED display medium. As is well known to persons skilled in the art, pixels of an OLED display device has a single substrate with an upper encapsulation layer.

The display device of the embodiments described above may be flexible, that is, the whole of the active area defined by the pixels of the display device exhibits flexibility i.e. can be bent multiple times without breaking. In particular the first and second layers referred to above may be made of a deformable plastic substrate e.g. Cellulose triacetate (TAC), Polyethylene terephthalate (PET), Polyethylene naphthalate (PEN), Polyimide (PI), or acrylic based etc. (replacing the conventional glass substrate) such that the display device has flexibility and can be rolled, folded, bent, etc. In alternative embodiments, the first and second layers referred to above are made of glass such that the active area defined by the pixels of the display device does not exhibit such flexibility however are shaped for conformal mounting to a curved surface. Alternatively, the display device could be a non-flexible type which could be merely comfortable to bend one time only.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A display device for conformal mounting on a curved surface inclined at an oblique angle relative to a horizontal plane, the display device comprising:
    a plurality of pixels;

a first set of conductive lines connected to the plurality of pixels; and a second set of conductive lines connected to the plurality of pixels, wherein the first set of conductive lines and the second set of conductive lines are arranged to define a shape of each of the plurality of pixels such that the pixels appear, to a viewer, to extend at least one of horizontally or vertically across the display device when the display device is mounted on the curved surface, and wherein the shape of each of the plurality of pixels in a parallelogram, and has a pair of equal opposing oblique angles corresponding to said oblique angle of inclination of the curved surface.

2. The display device according to claim 1, wherein the shape and a size of each of the plurality of pixels is uniform.

3. The display device according to claim 2, wherein the shape of each of the plurality of pixels is a rhombus or rhomboid.

4. The display device according to claim 1, wherein the shape and a size of each of the plurality of pixels is non-uniform.

5. The display device according to claim 4, wherein the shape of each of the plurality of pixels has one or more of: curved sides, internal angles which sum to an angle different to 360 degrees, and non-parallel sides.

6. The display device according to claim 4, wherein the first set of conductive lines and the second set of conductive lines are arranged such that the pixels appear, to a viewer at predetermined fixed position relative to the display device, to extend both horizontally and vertically across the display device when the display device is mounted on the curved surface inclined at the oblique angle relative to the horizontal plane.

7. The display device according to claim 1, wherein the plurality of pixels comprise:

a first layer comprising a first substrate;

a second layer disposed over and spaced from the first substrate; and a display medium disposed between the first and second layers, wherein the second layer comprises at least one of a second substrate and an encapsulation layer.

8. The display device according to claim 7, wherein the display medium is a liquid crystal display medium.

9. The display device according to claim 7, wherein the display medium is an organic or inorganic light emitting diode display medium.

10. The display device according to claim 1, wherein the first set of conductive lines and the second set of conductive lines form an active matrix array.

11. The display device according to claim 1, wherein the first set of conductive lines and the second set of conductive lines form a passive matrix array.

12. The display device according to claim 1, wherein the display device is flexible.

13. The display device according to claim 1, wherein each pixel comprises a plurality of sub-pixels, and at least one sub-pixel of the plurality of sub-pixels is connected to a first conductive line of the first set of conductive lines, and at least one further sub-pixel in the pixel is connected to at least one further conductive line of the first set of conductive lines.

14. The display device according to claim 1, wherein each pixel comprises a plurality of sub-pixels, and at least one sub-pixel of the plurality of sub-pixels is connected to a first conductive line of the second set of conductive lines, and at least one further sub-pixel in the pixel is connected to at least one further conductive line of the second set of conductive lines.

15. A method of manufacturing a display device, the method comprising:

determining an oblique angle of a curved surface inclined relative to a horizontal plane onto which the display device is to be mounted;

arranging a first set of conductive lines and a second set of conductive lines to define a shape of each of a plurality of pixels such that the pixels appear, to a viewer, to extend at least one of horizontally or vertically across the display device when the display device is mounted on a curved surface inclined at the oblique angle relative to a horizontal plane;

forming the plurality of pixels according to the defined shape of each of the plurality of pixels, wherein the first set of conductive lines and the second set of conductive lines are arranged to define a parallelogram shape of each of the plurality of pixels, the parallelogram having a pair of equal opposing oblique angles corresponding to said oblique angle of inclination of the curved surface; and connecting the first set of conductive lines and the second set of conductive lines to the plurality of pixels.

16. The method according to claim 15, wherein said arranging comprises:

using a computing device to generate a three-dimensional model of the curved surface;

and project a grid onto the curved surface such that the grid is distorted by the surface; and arranging the first set of conductive lines and the second set of conductive lines such that the plurality of pixels have shapes defined by the distorted grid.

17. A system comprising:

a display device for conformal mounting on a curved surface inclined at an oblique angle relative to a horizontal plane; and an item having the curved surface, wherein the display device comprises:

a plurality of pixels;

a first set of conductive lines connected to the plurality of pixels; and a second set of conductive lines connected to the plurality of pixels, wherein the first set of conductive lines and the second set of conductive lines are arranged to define a parallelogram shape of each of the plurality of pixels such that the pixels appear, to a viewer, to extend at least one of horizontally or vertically across the display device when the display device is mounted on the curved surface, the parallelogram having a pair of equal opposing oblique angles corresponding to said oblique angle of inclination of the curved surface.

* * * * *